Nov. 3, 1970 J. J. ANDREA ET AL 3,538,450

PHASE LOCKED LOOP WITH DIGITAL CAPACITOR AND VARACTOR TUNED OSCILLATOR

Filed Nov. 4, 1968 6 Sheets-Sheet 1

INVENTORS.
JOHN J. ANDREA
ROGER C. DEBLOOIS
NOEL E. HOGUE
BY Donald W. Phillion
ATTORNEY INVENTORS.
JOHN J. ANDREA
ROGER C. DEBLOOIS
NOEL E. HOGUE
BY Donald W. [signature]
ATTORNEY INVENTORS.
JOHN J. ANDREA
ROGER C. DEBLOOIS
NOEL E. HOGUE
BY Donald W. Phillion
ATTORNEY INVENTORS.
JOHN J. ANDREA
ROGER C. DEBLOOIS
NOEL E. HOGUE
BY Donald W. Phillion
ATTORNEY INVENTORS.
JOHN J. ANDREA
ROGER C. DEBLOOIS
NOEL E. HOGUE
BY Donald W. Phillion
ATTORNEY INVENTORS.
JOHN J. ANDREA
ROGER C. DEBLOOIS
NOEL E. HOGUE
BY Donald W. Phillion
ATTORNEY United States Patent Office 3,538,450

Patented Nov. 3, 1970

3,538,450
PHASE LOCKED LOOP WITH DIGITAL CAPACITOR AND VARACTOR TUNED OSCILLATOR

John J. Andrea, Marion, and Roger C. DeBloois and Noel E. Hogue, Cedar Rapids, Iowa, assignors to Collins Radio Company, Cedar Rapids, Iowa, a corporation of Iowa Filed Nov. 4, 1968, Ser. No. 772,895
Int. Cl. H03b 3/04
U.S. Cl. 331—10 24 Claims

ABSTRACT OF THE DISCLOSURE

A closed loop structure, including a frequency-phase discriminator and a reference signal source for tuning an oscillator and comprising means of digitally selecting one or more of a bank of fixed capacitors having values which increase in binary order. A binary counter, responsive to the output of a clock pulse source counts up or down in accordance with the discriminator output to control a switch which in turn adds or subtracts discrete increments of capacitance from said bank of capacitors into the oscillator circuit. The amount of capacitance in the oscillator circuit is determined directly by the count of said counter.

This invention relates generally to master oscillators and more particularly to a stabilized master oscillator (SMO) employing a digitally determined capacitance.

Many present day stabilized master oscillators employ several tuned variable capacitors as the means for establishing and maintaining the precise frequency of the master oscillator. More specifically, the tuned variable capacitor forms part of a loop which also includes a frequency and phase discriminator and a reference frequency. The discriminator compares the reference frequency with the divided-down output of the master oscillator to produce a D-C voltage which in turn tunes the variable capacitor to a value such as to obtain phase lock between the output of the oscillator and the reference signal.

One of the principal problems of the tuned variable capacitor, particularly in equipment which is subject to vibration is FM distortion. It has been found that in many applications, up to 20 db's of improvement is possible if fixed capacitors are employed to tune the master oscillator rather than tuned variable capacitors. The use of fixed capacitors for such a purpose, however, has presented many difficulties. Such difficulties include, among others, the problem of adding or subtracting capacitance from the master oscillator in small enough increments, and control means for causing such small increments of fixed capacitance to be either added or subtracted from the master oscillator in accordance with the particular need at a given time, and thirdly, the problem of obtaining phase lock. Phase lock presents a problem in that the addition or subtraction of discrete increments of capacitance in all likelihood will not result in the exact capacitance required to obtain and maintain phase lock.

It is an object of the present invention to provide a stabilized master oscillator employing fixed capacitors rather than a tuned variable capacitance.

A second object of the invention is to provide a stabilized master oscillator which is relatively immune to vibration.

A third object or purpose of the invention is a stabilized master oscillator employing digitally selected fixed capacitances and which is substantially immune to vibration.

A further object of the invention is the improvement of stabilized master oscillators generally.

In accordance with the invention, there is provided in combination with an oscillator a digitally selectable capacitance for tuning said oscillator, said digitally selectable capacitance comprising a bank of fixed capacitors which are connectable individually, or in combinations thereof, into the oscillator in discrete increments in response to the changing count of a bi-directional counter, which in turn is controlled by the output of a frequency and phase discriminator and a clock source as set forth below.

The frequency and phase discriminator is responsive to the frequency $f_r$ of a reference signal and to the frequency $f_o/10$ of the oscillator output signal to produce a D-C control signal indicative of the relative values of $f_r$ and $f_o/10$. A first control means is responsive to the D-C control signal to cause clock pulses from said clock pulse source to be supplied to the bi-directional counter, thereby causing said counter to count in a direction determined by the nature of said control signal, thus increasing or decreasing the total fixed capacitance connected into the oscillator circuit.

In accordance with a feature of the invention, there is provided a small voltage responsive variable capacitor which is also connected into the tuned circuit of said oscillator. Upon completion of frequency pull-in with said fixed capacitors, said control means will then function to block said clock pulses from said counter and connect the output of said discriminator to said variable capacitor, thus completing a phase lock loop circuit and establishing phase lock between the output of the standard master oscillator and the reference signal.

In accordance with another feature of the invention, the said counter is a binary counter and the values of the individual capacitors of said bank of capacitors increase in value in a binary manner, i.e., said fixed capacitors increase in value by successive factors of 2. Thus as the counter counts in the binary system, the combination of fixed capacitors connected into the oscillator will change in such a manner that for each count of the counting means, one unit of capacitance will be added or subtracted into or from the oscillator, depending on whether said counter is counting up or down.

The foregoing and other objects and features of the invention will be more fully understood from the following detailed description thereof when read in conjunction with the drawings in which.

Figures 4, 5, 6:
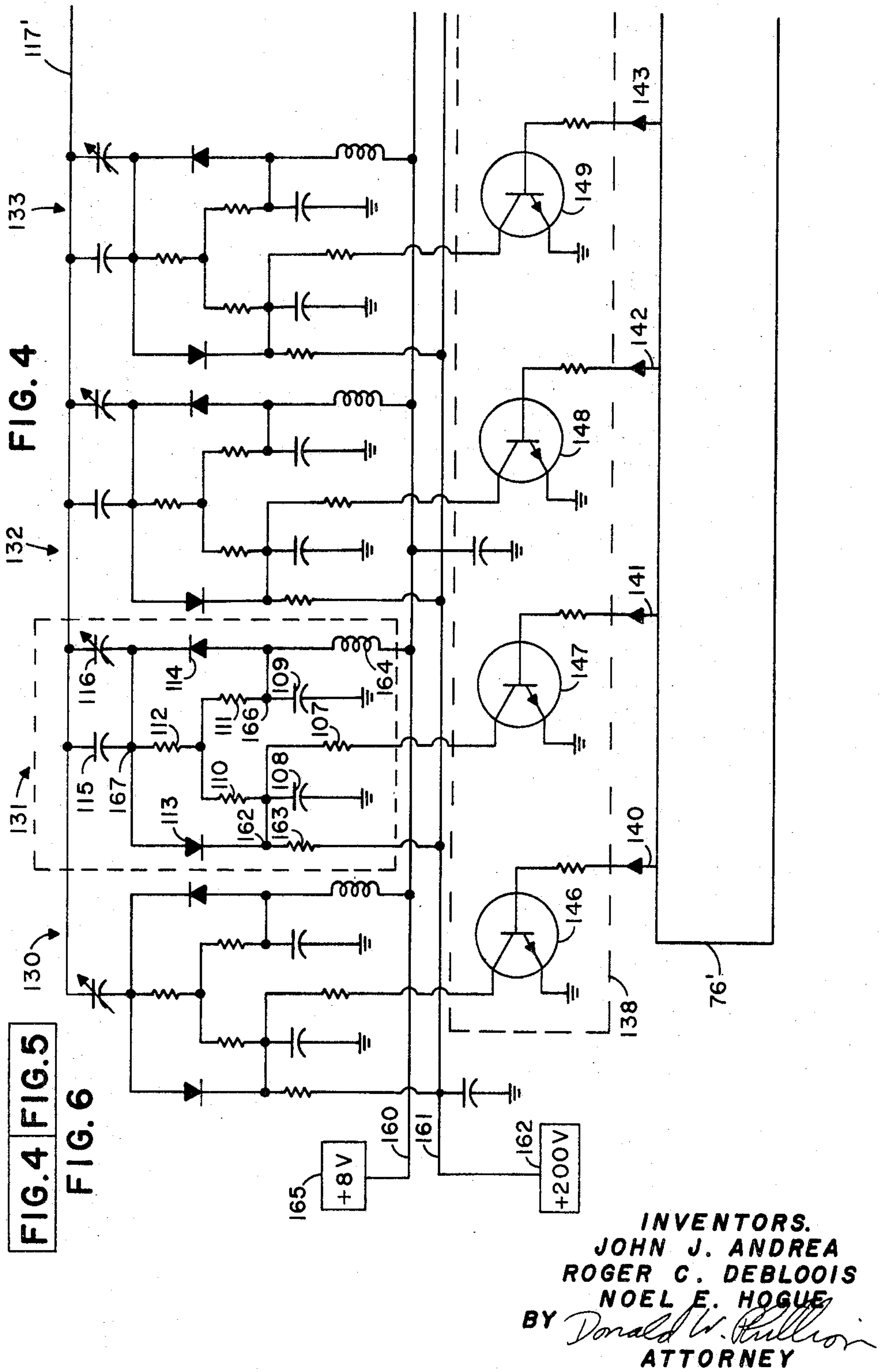
Figure 5:
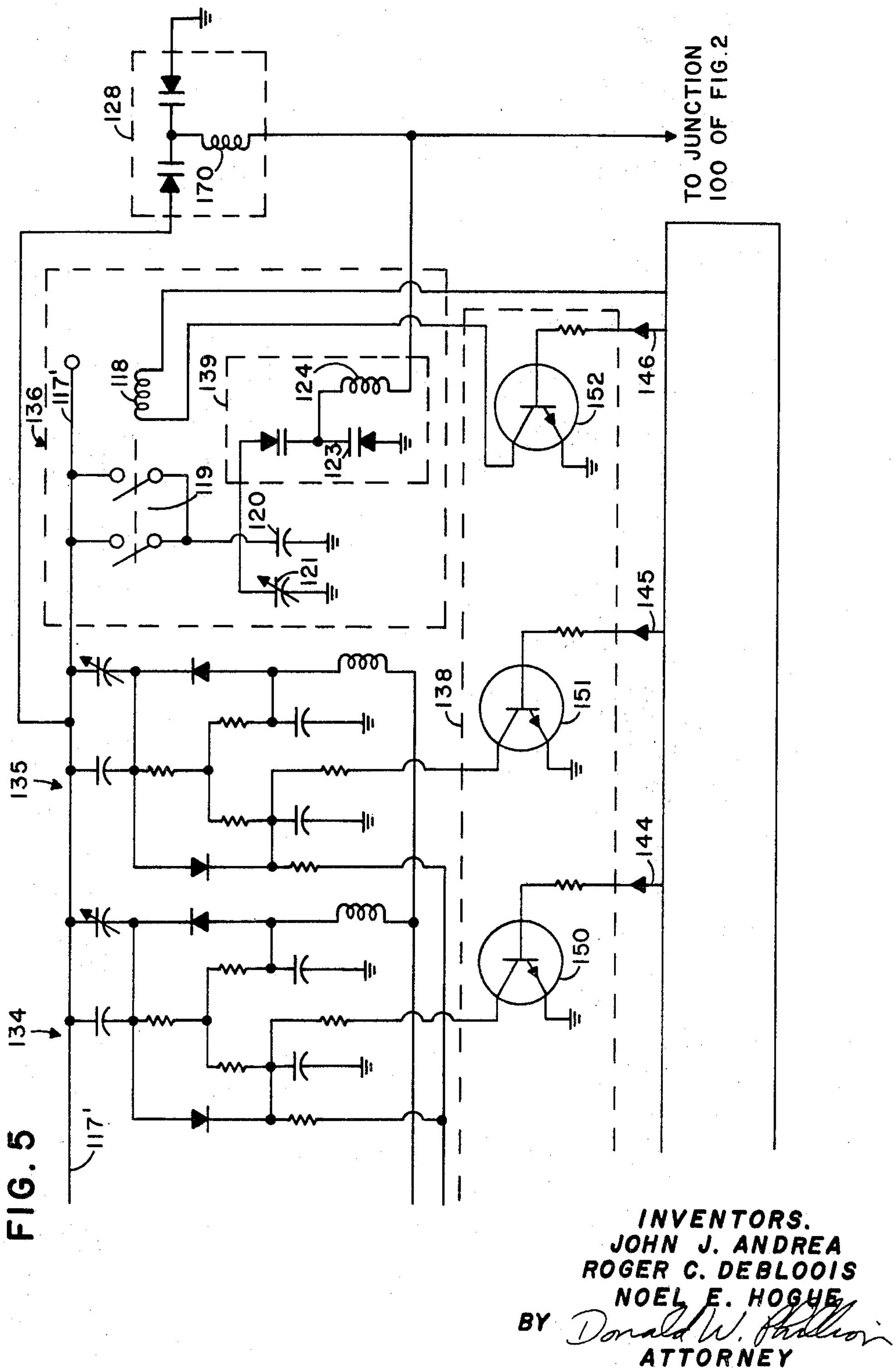

FIGS. 4 and 5 together constitute a schematic diagram of the binary capacitor system;

FIG. 6 shows how FIGS. 4 and 5 fit together; and

Figure 7:
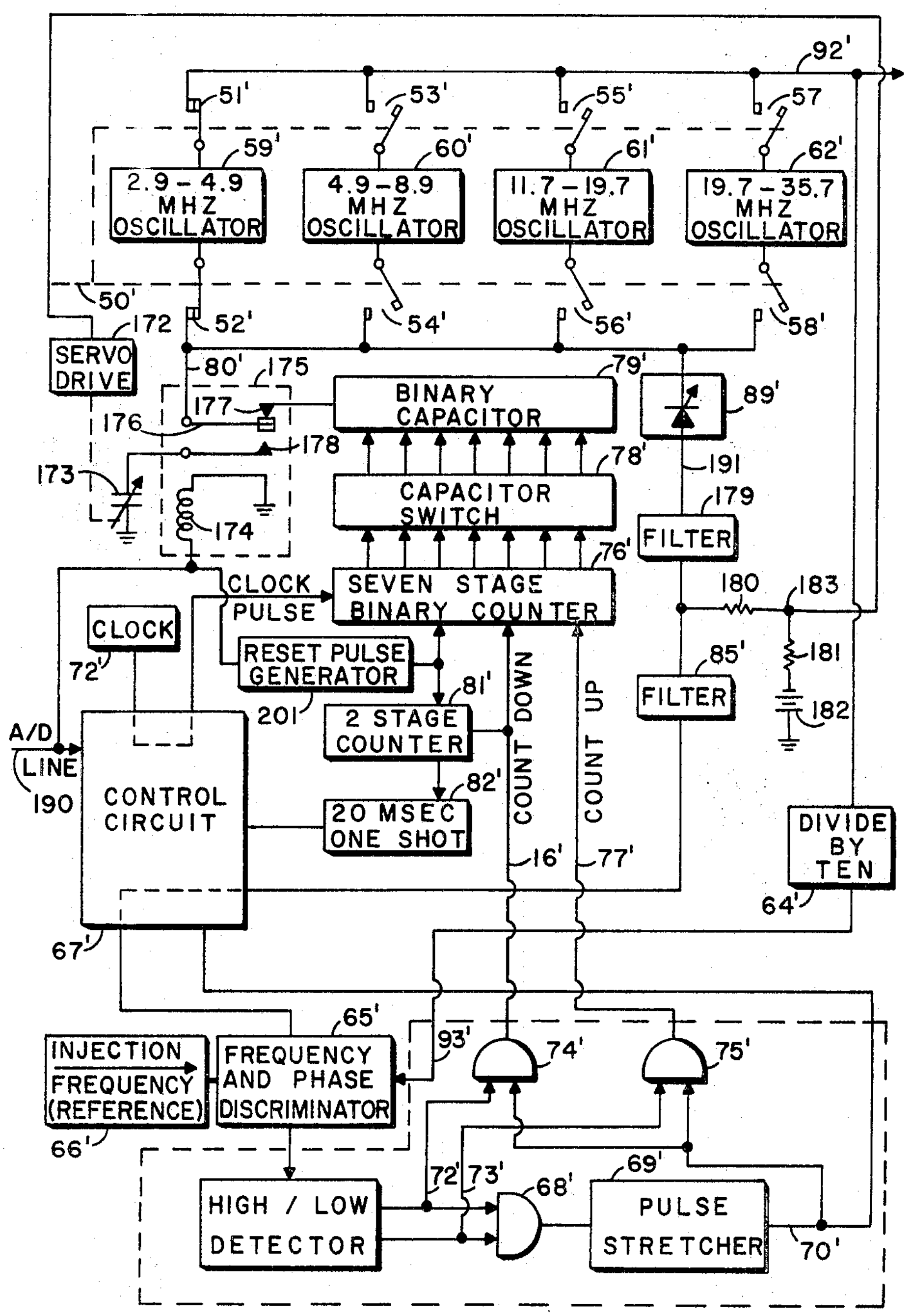

FIG. 7 is a logic diagram of a modified form of the invention.

Figure 1:
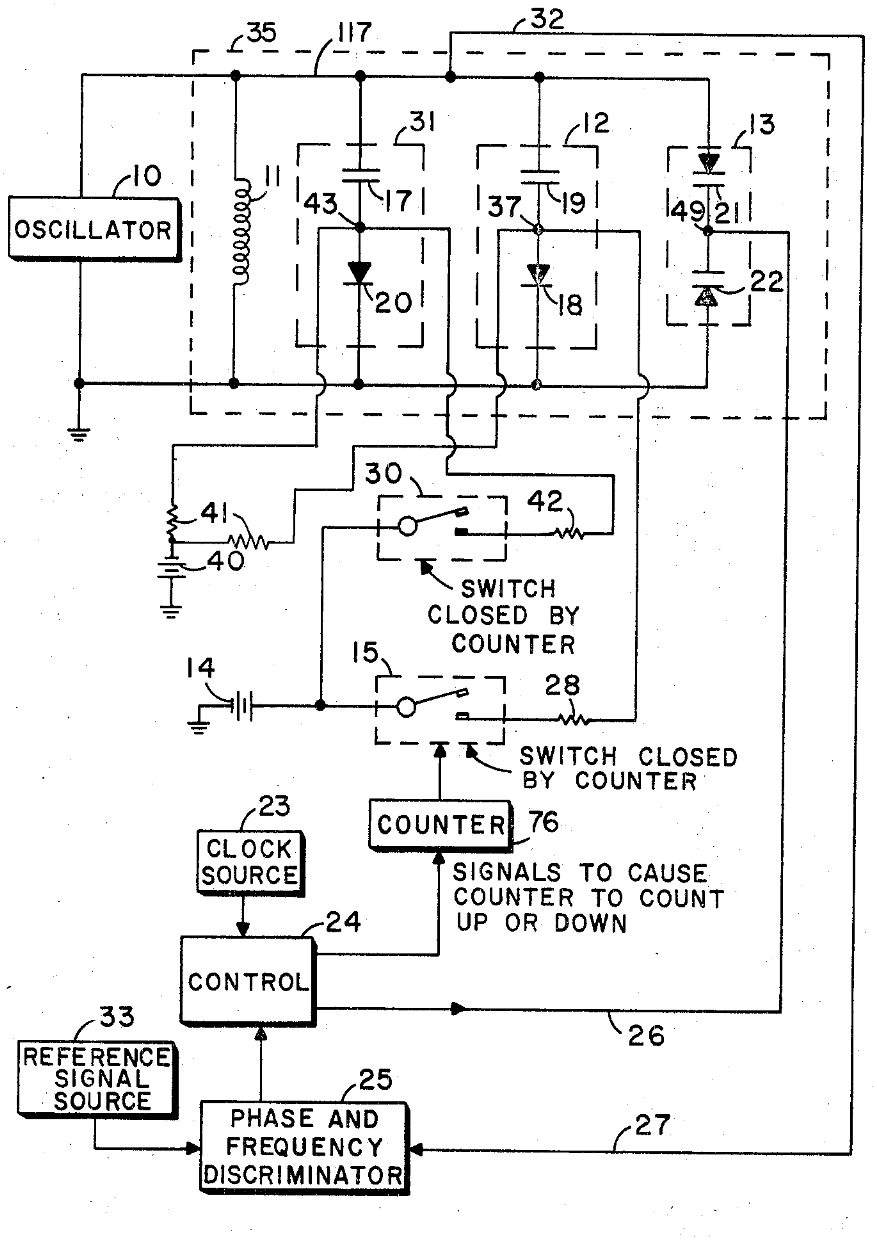
FIG. 1 is a combination schematic and block diagram showing generally how the invention is employed in an oscillator circuit.

Referring now to FIG. 1, there is shown the general concept of the invention. More specifically, in FIG. 1, oscillator 10 has a tunable circuit comprising an inductor 11 and a capacitance. The capacitance can be the selectable capacitance shown in block 31 or, alternatively, that shown in block 12 in parallel with a variable capacitor shown within block 13.

The capacitors within blocks 31 and 12 of FIG. 1 are two of a larger number of selectable capacitors which can be introduced in the oscillator circuit under control of the output of a counter 76 to increase or decrease the frequency of oscillator 10.

Before discussing how the counter 16 functions in selecting the capacitance to be connected into the circuit of oscillator 10, a more general view of the circuit will first be discussed.

The overall object of the circuit is to place sufficient capacity in the tuned circuit of oscillator 10 so that the frequency of the output signal of oscillator 10, which appears on terminal 32, is phase locked with the frequency of a reference signal generated in reference signal source 33. A phase and frequency discriminator 25 compares the signals from reference signal source 33 and from oscillator 10 to produce a D-C output signal whose polarity indicates whether the frequency of the oscillator output signal is greater or less than that of the reference signal. A frequency-phase discriminator which is suitable for use in this invention is disclosed in U.S. application Ser. No. 696,205 filed on Jan. 8, 1968 by John Andrea and entitled "Digitalized Frequency and Phase Discriminator" and now Pat. No. 3,431,509.

If the frequency of oscillator 10 is different than that of the reference signal, the control circuit 24 will respond thereto to supply to counter 76 a series of clock pulses from clock pulse source 23, and also a control voltage which will determine whether said counter is to count up or down in response to the clock pulses.

Assume, for purposes of discussion, that the frequency of oscillator 10 is greater than of the reference signal. Under such assumption the counter will be caused to count upward, thus adding capacitance into the tuned circuit 35 of the oscillator 10 and thereby lowering the frequency thereof. Such capacitance is added into tuned circuit 35 by means of the closure of one or more of the switches such as switches 15 and 30 of FIG. 1. More specifically, at some predetermined count of the counter 76, the switch 15, for example, will be closed and the battery 14 will be connected through a weighting resistor 28 to the junction 37 of selectable capacitance 19. The positive voltage applied at junction 37 functions to open the normally closed diode 18, thereby connecting capacitor 19 into the tuned circuit of oscillator 10. It is to be noted that diode 18 is normally nonconductive due to the negative battery source 40 which is connected to junction 37 through resistor 41. The values of resistors 28 and 41 are such that when switch 15 is closed, the potential of point 37 will become positive and thereby open, i.e., make conductive, the diode 18.

Similarly, the capacitance 17 can be connected into the oscillator 10 tuned circuit when the counter 76 contains the count which will function to close switch 30, thereby connected the positive battery source 14 through resistor 42 to the junction of 43 of circuit 31.

As mentioned above, the selectable circuits 31 and 12 represent only two of a plurality of circuits containing capacitances which can be switched into the tuned circuit of oscillator 10. All of these capacitors, however, contain discrete or fixed values of capacitances which in all likelihood will not be of exactly the right value, in any combination, to permit phase lock of the oscillator output signal with that of the reference source 33.

Figure 3:
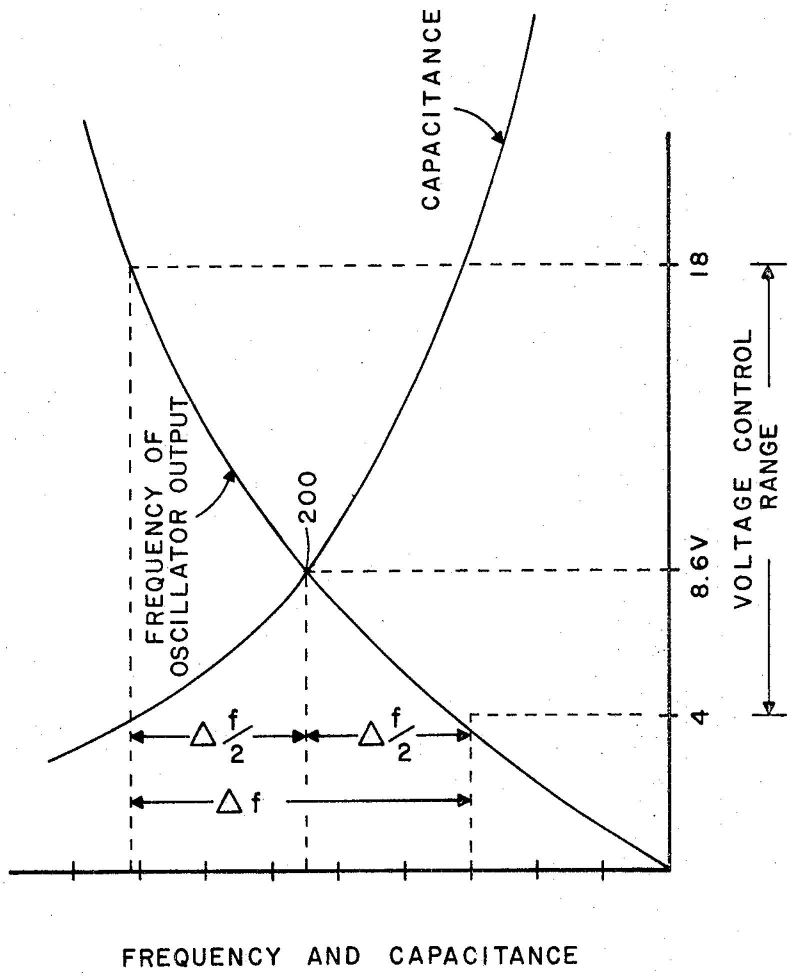
FIG. 3 is a chart showing the frequency-voltage characteristic of the variable capacitor employed in the circuit of FIG. 2.

To facilitate such phase lock, there is provided a circuit 13 comprising a pair of voltage responsive variable capacitors 21 and 22 which are connected in series across the output oscillator 10. These two variable capacitors 21 and 22 have the characteristics of changing their capacitances in response to the voltage supplied thereto via input lead 26 from control means 24. The frequency vs. voltage characteristic of variable capacitors 21 and 22 is shown in FIG. 3.

As will be discussed in more detail later, the control circuit 24 is constructed to respond to a condition of frequency pull-in of oscillator 10 with that of reference signal 33 to cut off the supply of clock pulses to counter 76, thus terminating the counting of counter 76. At this same time, the control circuit 24 will connect the output of phase and frequency discriminator 25 to the junction 49 between variable capacitors 21 and 22. Such output from discriminator 25 will be in the form of a D-C voltage whose polarity indicates the lead or lag condition of the phase of the output signal of oscillator 10 with respect to the signal from reference source 33, and will change the value of the capacitors 21 and 22 to a value whereby phase lock occurs between the two signals.

Figure 2:
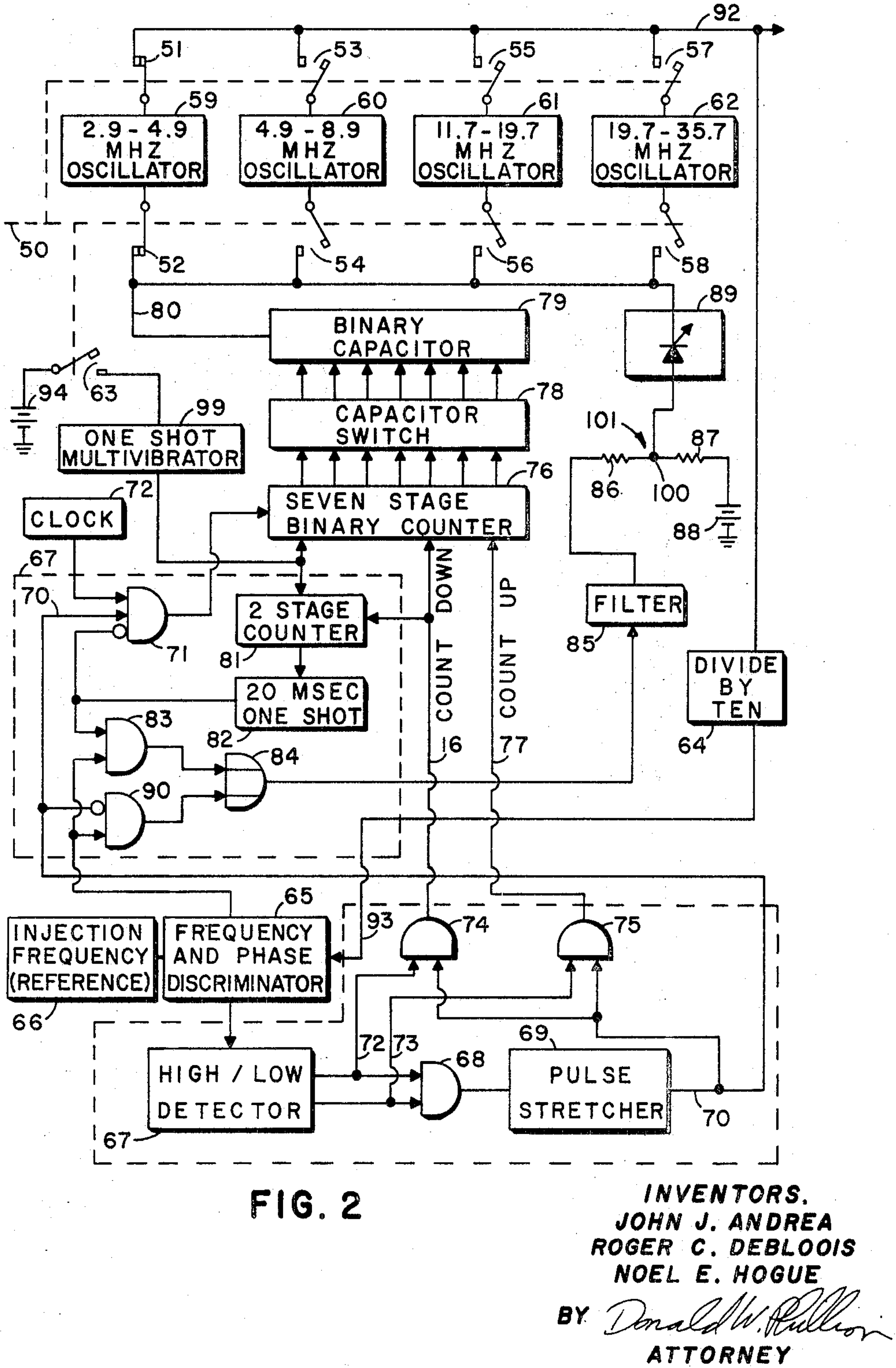
FIG. 2 is a logic diagram of the invention.

Referring now to FIG. 2, there is shown a detailed block diagram of the invention. In FIG. 2, the frequency range of the system can be increased to wide ranges by the use of several oscillators such as oscillators 59, 60, 61 and 62, each of which covers a different range of frequencies. Each of these oscillators can be individually and selectively connected into the circuit by means of gang switch 50 which selectively operates one of the four pairs of switches 51 and 52, 53 and 54, 55 and 56 or 57 and 58. It is to be noted that three of the four pairs of switches are always open, thus completely removing the three oscillators associated therewith from the system, and leaving only one oscillator connected into the system, as for example oscillator 59, which is shown with its associated switches 51 and 52 closed.

For purposes of example, assume that it is desired to produce from oscillator 59 an output of 3 mHz. In accordance therewith, a 300 kHz. reference signal is supplied to the frequency and phase discriminator 65 from reference source 66, which frequency is exactly one-tenth of the desired frequency of 3 mHz. The output of oscillator 59 is supplied to divide-by-ten circuit 64, the output of which is supplied to the other input terminal 93 of frequency and phase discriminator 65.

Assume that operation of the system is initiated by closing switches 51, 52 and 63, the switching arrangement is designed so that switch 63 closes an instant before switches 51 and 52 and energizes one-shot multivibrator 99 which provides an output pulse to reset counters 76 and 81. Further assume that at the initiation of operation, the output signal from oscillator 59 is 3.9 mHz. which is 0.9 mHz. above the desired frequency. The said 3.9 mHz. signal is supplied via output lead 92 through the divide-by-ten circuit 64 to discriminator 65 as a 390 kHz. signal. The discriminator circuit 65 will respond to the 390 kHz. signal and the 300 kHz. reference signal to produce a D-C output signal which is detected by high/low detector 67. The detector 67 produces an output signal on one of its two output leads, depending on whether the output from discriminator 65 was a positive D-C or a negative D-C voltage.

It is to be understood that the output signal from high/low detector 67 is always a positive voltage whether it appears on output lead 72 or output lead 73. The polarity of the voltage from discriminator 65 is reflected in which of the two output leads, 72 or 73, is positive.

Since the frequency of oscillator 59 is above the reference frequency, assume that the positive output signal appears on output terminal 73 of detector 67. Such output signal will be supplied to two circuits, the first circuit being AND gate 68 and pulse stretcher 69, which responds thereto to supply a stretched pulse to gate 71 which will open to permit passage of clock pulses from source 72 therethrough to seven stage binary counter 76. Said binary counter 76 is constructed to count either up or down is response to said clock pulses, but only when there is an appropriate signal on one of the two leads 16 or 77, as discussed below.

The positive output from high/low detector 67 appearing on terminal 73 of detector 67 is also supplied to one input of AND gate 75. Since the other input of AND gate 75 is connected to the output of pulse stretcher 69, there will be an output signal from AND gate 75 in lead 77 which is the count-up control lead. The clock pulses supplied to the seven stage binary counter 76 will cause said binary counter to count up.

The counting up binary counter 76 will function to add capacitance to oscillator circuit 59 by means of switch 78 and the bank of capacitors 79 as discussed in the following paragraphs.

The said capacitor switch 78 consists of a bank of switches corresponding to the switches 15 and 30 of FIG. 1, with one switch for each stage of the binary counter. Also corresponding to each stage of the binary counter is one of the binary capacitors contained in a bank of binary capacitors 79. Said bank of capacitors 79 have values in accordance with increasing powers of 2. More specifically, the bank of capacitors 79 will contain, for example, capactiors having values of 1 picofarad, 2 picofarads, 4 picofarads, 8 picofarads, 16 picofarads, 32 picofarads and 64 picofarads, each of which can be connected into the tuned circuit of oscillator 59 either individually or in combination with any other capacitors therein.

Thus, for example, if the binary counter contains a count of 18, then the second stage and the fourth stage thereof will contain binary "1's" so that the second and fourth switches of the seven switches of switch 78 will be closed and the capacitors having values of 2 picofarads and 16 picofarads wil be connected into the oscillator circuit 59.

It should be noted that when the circuit operation is initiated, the seven stage binary counter is set to the midpoint of its count. Specifically, it is set at count 64 so that it can either add 63 or subtract 64 picofarads into or from the tuned circuit of oscillator 59 in one picofarad steps, and thus increase or decrease the oscillator frequency by substantially equal maximum amounts.

As mentioned above, such resetting is accomplished by closure of switch 63 which supplies a resetting pulse to the seven stage counter 76 and also to the two stage counter 81, the purpose of which will be discussed in detail below.

At some point, the addition of one additional picofarad to the tuned circuit of oscillator 59 will cause the frequency of the output thereof to decrease below the frequency of the reference signal. At this time, the output of the discriminator 65 will change polarity so that the positive output of detector 67 will switch from output lead 73 to output lead 72, thereby opening AND gate 74 and closing AND gate 75. The output from AND gate 74 is the count-down lead 16 which will cause the seven stage binary counter to count down one step upon the occurrence of the next clock pulse from clock source 72.

The count-down pulse appearing on lead 16 will also cause two stage counter 81 to count from its zero reset condition to a count of 1.

As discussed above, the count-down pulse will cause the removal of 1 picofarad from the tuned circuit of oscillator 59. The removal of this 1 picofarad will, in all probability, cause the frequency of oscillator 59 to again rise above the frequency of the reference signal which condition in turn will cause the polarity of the output signal of discriminator 65 to reverse. Such polarity reversal will cause the positive output of detector 67 to appear on lead 73 which will open (make conductive AND gate 75 and close AND gate 74.

The output from AND gate 75 causes the binary counter to add 1 picofarad to the tuned circuit of oscillator 59, which in turn will cause the frequency to decrease below that of the reference signal 66 at the occurrence of the next clock pulse.

The cycle repeats in that the output of discriminator 65 is now negative again so that the positive output of detector 67 appears on terminal 72 to energize AND gate 74 and produce a signal on count-down lead 16. The next clock pulse 72 causes binary counter to count-down one count.

Also the signal appearing on the count-down lead 76 causes two stage counter 81 to advance from a count 1 to a count of 2.

As the cycle continues the binary counter continues to count up 1 and then down 1 until the two stage counter has a count of 3 therein. At such time, the two stage counter 81 will supply an output signal to 20 microsecond one-shot circuit 82 which, in turn, will supply a 20 microsecond pulse to AND gate 83 and to inhibit AND gate 71. AND gate 83 is opened and inhibit AND gate is thereby closed. Closure of gate 71 blocks the pulses from clock source 72 from entering binary counter 76, thus effectively turning off said counter.

Opening of AND gate 83 permits the output of frequency and phase discriminator 65 to pass therethrough and then through OR gate 84, filter 85 and across the potential divider 101 consisting of resistors 86 and 87, and terminating in positive battery source 88.

The potential of tap 100 of voltage divider 101, in the absence of an output from OR gate 84, is 8.6 volts, a value selected to place the capacitance of variable capacitor 89 in the middle of its variable capacitance range, as shown by point 200 of the curve of FIG. 3.

Thus when the output from OR gate 84, which can be either a positive or a negative voltage, is supplied through filter 85, it will either lower or raise the potential of tap 100 above or below 8.6 volts to decrease or increase the capacitance of variable capacitor 89 and pull the phase of oscillator 59 signal towards phase lock with the reference signal. Phase lock will occur when a potential of terminal 100 reaches a proper value.

At phase lock the output of the high/low detector 67 drops to zero so that there is no positive output on either output lead 72 or 73 thereof. The output from pulse stretcher 69 will also go to zero so that both AND gates 74 and 75 will be disabled, as will AND gate 71. Disabling of AND gate 71 will permanently block the output of clock pulse source 72 from binary counter 76.

Further, when the output of pulse stretcher 69 goes to zero, the inhibit AND gate 90 will become opened, i.e., conductive, so that the output of the frequency and phase discriminator 65 will continue to pass therethrough and then through gate 84 and filter 85, and then be applied across the potentiometer 101.

It is important that inhibit AND gate 90 be conductive during the occurrence of the 20 microsecond pulse from multivibrator 82. The foregoing is true since at the termination of said 20 microsecond pulse, AND gate 83 will become nonconductive and the output of discriminator 65 can no longer pass therethrough. It must then pass through inhibit AND gate 90.

Thus the operation of the circuit has been completed. The seven stage binary counter now contains the necessary count to maintain frequency coincidence between the oscillator and the reference source and the variable capacitor 89 has a value to maintain phase lock between said two signals.

Referring now to FIGS. 4 and 5 there is shown in detail that portion of FIG. 2 including the seven stage binary counter 76, the capacitor switch 78, and the binary capacitor 79.

More specifically, in FIGS. 4 and 5, the binary counter is shown as block 76', the capacitor switch is shown as a group of transistors contained within the dotted block 138, and the binary capacitor comprises the rest of the circuit, except for the circuits within dotted rectangles 128 and 129 which correspond to the variable capacitor 89 of FIG. 2.

The binary capacitor of FIGS. 4 and 5 has seven stages identified by reference characters 130 through 136. The first six states, 130 through 135, are quite similar, with each stage being similar to the circuit within the dotted line encircling stage 131, Stage 136 is different from the other six stages 130 through 135 for reasons to be discussed later.

Associated with each stage is a transistor switch, all of which are included within the dotted block 138 and identified by characters 146 through 152. Each of said transistor switches is energized by one of the seven outputs 140–146 of counter 76'. The said counter 76' is a binary counter and any combination of the transistor switches 146 through 152 can be closed (made conductive) at a given time.

The seven stages 130 through 136 of the binary capacitor are constructed so as to introduce capacitance into the oscillator circuit in accordance with the following table:

| Counter output | Stage No. | Capacitance value, pf. |
|---|---|---|
| 140 | 130 | 1 |
| 141 | 131 | 2 |
| 142 | 132 | 4 |
| 143 | 133 | 8 |
| 144 | 134 | 16 |
| 145 | 135 | 32 |
| 146 | 136 | 64 |

From the above chart, it can be seen that the values of the capacitances of stages 130 through 136 increases in ascending powers of 2 in accordance with the seven outputs of the binary counter 76′. With this system, the amount of capacitance added or subtracted into the oscillator circuit can be effected in discrete amounts of 1 picofarad over a range of 1 picofarad to 127 picofarads.

For example, if it is desired to enter 18 picofarads into the circuit, outputs 141 and 144 of counter 76′ would have "1's" thereon and the remaining outputs 140, 142, 143, 145 and 146 would have "0's". Said counter 76′ would contain a count of 18 and would energize the two transistor switches 147 and 150 which, in turn, would introduce into the tuned circuit of oscillator 29 the 2 picofarad capacitance of stage 13 and the 16 picofarad capacitance of stage 134.

Since the operation of stages 130 through 135 are all substantially the same, only one of such stages will be discussed in detail. Such stage will be stage 131.

When output lead 141 of counter 76′ has a "0" thereon, the transistor 147 is off, i.e., is nonconductive. Under such conditions, a circuit can be traced from 200 volt source 162 through lead 161, resistor 163, junction 162, resistor 110, resistor 111 and coil 164 back to plus 8 volt source 165. Since resistors 110 and 111 are very large compared to resistor 163, the potential of junction 162 will approach a plus 200 volts and the potential of junction 166 will be near plus 8 volts. The potential of junction 167 will be substantially mid-way between the potential of junctions 162 and 166 or somewhere around 100 volts positive. Under these conditions, both diodes 113 and 114 will be cut off so that there is no path from the bottom plate of capacitor 115 to ground. Thus the said capacitor 115 is effectively removed from the tuned circuit of the oscillator (not shown in FIGS. 4 and 5). It should be noted that the lead 117′ of FIG. 4 corresponds to the lead 117 of FIG. 1, and is the connection to the oscillator.

When a "1" appears on output 141 of counter 76′, the switching transistor 147 is energized and establishes a path from junction 162 to ground through resistor 107 and the now conductive switching transistor 147. The resistor 107 is very small compared to resistor 163, being of the order of one-half of 1% thereof. Consequently, the potential of junction 162 will decrease to a few tenths of a volt. Since the potential of junction 166 is still about 8 volts, the potential of junction 167 will become about 4 volts, thus causing both of the diodes 113 and 114 to become conductive. Thus a low impedance path is established from the lower plate of capacitor 115 to ground. More specifically, there are now two parallel paths connecting the lower plate of capacitor 115 to ground. These two parallel paths are through the diodes 113 and 114 and the capacitors 108 and 109, each of which has a value very large in comparison with capacitor 115. Specifically, capacitors 108 and 109 can be of the order of 2,000 picofarads each. The use of two parallel paths to ground is employed to make certain that the impedance from the lower plate of capacitor 115 to ground is, in fact, a very low impedance.

The capacitor 115 is now effectively connected into the tuned circuit of the oscillator 10 of FIG. 1, or the oscillator 59 of FIG. 2.

Associated with capacitor 115 is a small 0.5 to 3.0 picofarad variable capacitor 116. Capacitor 116 is employed to bring the total capacitance introduced into the oscillator up to 2 picofarads; the capacitor 115 comprising about 1 picofarad thereof. Capacitor 116 is made variable so that it can be adjusted to produce an overall capacitance equal to 2 picofarads. Each of the other stages, except the first stage 130 has a variable capacitance associated therewith for similar purposes.

The first six stages 130 through 135 have the capability of introducing a total of 63 picofarads into the oscillator circuit. If it is desired to add more than 63 picofarads into the oscillator circuit it is necessary to utilize stage 136 which has a capability of introducing 64 picofarads. Due to the relative large current which will flow through the 64 picofarads of stage 136 when it is connected into the oscillator circuit, and the switching of additional variable capacitors into the circuit, the use of diodes for switching purposes is not feasible. Such large current flow through the capacitors and the difficulty of switching the additional variable capacitors into the circuit make the use of a relay more practical.

Consequently, the capacitor of stage 136 is switched into the oscillator circuit by means of transistor 152 in coopertaion with a relay winding 118 and associated contacts 119. More specifically, when output 146 of counter 76′ has a "1" thereon, transistor 152 will energize relay winding 118 which is connected in the collector electrode circuit thereof. Energization of winding 118 will close contacts 119 and connect capacitor 120 and its associated trimmer capacitor 121 into the oscillator circuit.

As mentioned above, the circuits within the dotted blocks 128 and 139 correspond to the variable capacitor 89 of FIG. 2, which is also the variable capacitor represented within block 13 of FIG. 1. More specifically, the use of the two variable capacitors 128 and 139 in FIG. 5 is due to the following cause. The variable capacitor 128 functions alone with the first six stages 130 through 135 of FIGS. 4 and 5 and is energized through the isolating R-F choke 170 from the junction 100 of FIG. 2. However, when stage 136 is switched into the oscillator circuit, the total amount of capacitance has become so large that additional variable capacitance is needed in order to pull the frequency over a sufficiently wide range for phase lock purposes. Consequently, at the time that stage 136 is switched into the system, a second variable capacitor arrangement 139 is also switched into the circuit by the closure of contacts 119.

Referring now to FIG. 7, there is shown a form of the invention which can be employed advantageously in electronic gear wherein it is necessary to tune other portions of the equipment in addition to the master oscillator as, for example, the R-F stages, the intermediate frequency stages, and perhaps an antenna coupling means.

It is neither necessary nor desirable to tune such other parts of the equipment by circuit means as sophisticated and expensive as the binary capacitor shown in FIGS. 2, 4 and 5. More specifically, such other portions of the equipment can be tuned by a large gang type capacitor.

In the circuit of FIG. 7 there is provided such a variable capacitor, identified as capacitor 173 and driven by a servo means 172. The circuit operates generally as follows.

Relay 175 is initiated by a signal appearing on the analog-to-digital line 190 as a result of turning on the equipment or the selection of a new master oscillator frequency. Such analog signal energizes relay 175 to close armature 176 upon contact 178, thus connecting variable capacitor 173 into the oscillator circuit and completely disconnecting the binary capacitor 79′ therefrom.

The frequency capture and phase lock of the output of oscillator 59′ with a reference signal is then obtained through the use of the output of frequency and phase discriminator 65′ which is supplied through control circuit 67′, filter 85′ and through the voltage divider consisting of resistors 180 and 181 to the negative battery source 182. The potential appearing at tap 183 is employed to drive servo motor 172 in the proper direction to change the value of capacitance 173 until frequency capture and phase lock occurs between the output of oscillator 59′ and that of the reference signal.

The variable capacitor 173 has now been tuned to the proper value for the ganged R-F circuits, the intermediate frequency circuits and any other circuits in the equipment that need to be tuned. Subsequently, a signal will be generated on A/D line 190 indicating that digital tuning can be initiated. Such signal functions to de-energize realy 175 so that armature 176 closes on contact 177, thus disconnecting variable gang capacitor 173 from the circuit and connecting the binary capacitor and its associated circuits into the tuned circuit of oscillator 59′. The signal generated on A/D line 190 will also function to energize reset pulse generator 201 which will generate a pulse to reset counters 76′ and 81′. The operation of the circuit of FIG. 7 from this point on is substantially the same as described in connection with FIG. 5.

To illustrate more clearly the relationship between the analog and the digital portions of the operation, assume a specific set of conditions at the beginning of operation of the analog portion of the circuit. Specifically assume that the frequency of oscillator 59′ is at 3.9 mHz. and it is desired that it be at 3 mHz. Assume further that the output of discriminator 65′, after filtering, results in a voltage of 5 volts on lead 191. The values of resistors 180 and 181 and negative battery 182 are selected so that with a 5 volt potential on lead 191, the potential of tap 183 is negative. It is this negative voltage that will tend to drive the servo motor 172 in a direction so as to increase the value of capacitor 173, and thereby lower the frequency of oscillator 59′.

As discussed above, the variable capacitor 89′ is selected so that it is at its mid-value when the voltage supplied thereto is 8.6 volts. Since the 5 volts appearing on 191 is less than 8.6 volts the value of the capacitor 89′ will be caused to be greater than its mid-point value. Such a condition is undesirable at the time switchover from analog operation to digital operation occurs, and is changed before switchover in the following manner.

After the servo motor has driven the variable capacitor 173 to a value where frequency and phase capture occurs, there remains a negative voltage at tap 183 which will tend to cause the servo motor to continue to drive the capacitor 173 to an even greater value. However, such an occurrence will not change the frequency of oscillator 59′ an additional amount. What will happen is that the variable capacitor 89′ will decrease in value and the voltage on lead 191 will increase, which will cause the values of variable capacitor 89′ to decrease. This process will continue until the voltage at tap 183 goes to zero, at which time the servo motor 172 will be de-energized and the potential on lead 191 will be 8.6 volts, thus placing the value of variable capacitor 89′ at its mid-point.

At this time, as discussed above, a signal is supplied from some point in the associated equipment (not shown) to the analog-to-digital line 190 which will de-energize relay 175. Thus armature 176 will close upon contact 177 disconnecting variable capacitor 173 from oscillator 59′ and connecting binary capacitor 79′ thereto instead.

It can be seen that at the initiation of the digital portion of the tuning operation, the variable capacitor 89′ is at the mid-point of its range.

It is to be understood that the forms of the invention shown and described herein are but preferred embodiments thereof and that various changes may be made in circuit arrangement without departing from the spirit or scope of the invention.

What is claimed is:

1. Means for tuning an oscillator means comprising:
frequency reference signal source means;
frequency-phase discriminator means responsive to the output signal of said oscillator means and the output signal of said reference signal source means to produce a discriminator output signal having characteristics indicative of the relative frequency values of said output signals;
clock pulse source means;
a bank of capacitors having capacitance values which increase in a predetermined order;
switching means constructed when activated to selectively connect any one or any combination of the capacitors in said bank of capacitors into said oscillator means;
counting means responsive to the output signals of said clock pulse source means and said discriminator means to count up or count down in accordance with the characteristic of said discriminator output signal to activate said switching means in a predetermined manner calculated to connect or disconnect capacitors of said bank of capacitors into or from said oscillator means until frequency coincidence is obtained between the output signals of said oscillator means and said reference signal source means; and
control means responsive to the condition of frequency coincidence between the output signals of said oscillator means and said reference signal source means to disconnect said clock pulse source from said counting means.

2. Means for tuning an oscillator means in accordance with claim 1 comprising:
means constructed to reset said counting means to a given value immediately prior to the connecting of said bank of capacitors into said oscillator means;
and in which said switching means is constructed to respond to said given reset value of said counting means to connect a predetermined proportion of said bank of capacitors into said oscillator means;

3. Means for tuning an oscillator means in accordance with claim 2 and comprising:
variable capacitance means connected into said oscillator means;
and in which said control means is responsive to coincidence between the output signals of said oscillator means and said reference signal source means to thereafter supply the output of said discriminator means to said variable capacitance means to maintain phase lock between the output signals of said oscillator means and said reference signal source means.

4. Means for tuning an oscillator means in accordance with claim 3 in which:
said bank of capacitors increase in value in geometric progression;
and in which said counting means is a binary counting means.

5. Means for tuning an oscillator means in accordance with claim 1 in which:
said bank of capacitors increase in value in binary order progression;
and in which said counting means is a binary counting means.

6. Means for tuning an oscillator means in accordance with claim 5 and comprising:
variable capacitance means connected into said oscillator means;
and in which said control means is responsive to coincidence betwen the output signals of said oscillator means and said reference signal source means to thereafter supply the output of said discriminator means to said variable capacitance means to maintain phase lock betwen the output signals of said oscillator means and said reference signal source means.

7. Means for tuning an oscillator means comprising:

reference frequency source means;

discriminator means responsive to the output signals of said oscillator means and said reference frequency source means to produce an output signal having at least a first state and a second state and indicative of the relative frequency values of the output signals of said reference frequency source means and said oscillator means;

a plurality of capacitors having values which increase in predetermined order;

switching means comprising bi-directional counter means constructed to connect any one or any one of a plurality of predetermined combinations of said capacitors into said oscillator means in response to predetermined counts of said counter means;

clock pulse source means;

said counter means being responsive to the coincidence of said clock pulses and the first state of said discriminator output signal to count upwards and responsive to the coincidence of said clock pulses and the second state of said discrminator output signal to count downwards;

and control means responsive to the condition of requency coincidence between the outputs of said oscillator means and said reference frequency source means to terminate the counting of said counting means.

8. Means for tuning an oscillator means in accordance with claim 7 comprising:

means constructed to reset sadi counter means to a given value immediately prior to the connecting of said bank of capacitors into said oscillator means;

and in which said switching means is constructed to respond to said given reset value of said counting means to connect a predetermined proportion of said bank of capacitors into said oscillator means.

9. Means for tuning an oscillator means in accordance with claim 8 and comprising:

variable capacitance means connected into said oscillator means;

and in which said control means is responsive to cincidence between the output signals of said oscillator means and said reference frequency source means to thereafter supply the output of said discriminator means to said variable capacitance means to maintain phase lock between the output signals of said oscillator means and said reference frequency source means.

10. Means for tuning an oscillator means in accordance with claim 9 in which:

said bank of capacitors are arranged to increase in value in geometric progression;

and in which said counter means is a binary counter means.

11. Means for tuning an oscillator means in accordance with claim 7 in which:

said bank of capacitors are arranged to increase in value in binary order progression;

and in which said counter means is a binary counter means.

12. Means for tuning an oscillator means in accordance with claim 11 and comprising:

variable capacitance means connected into said oscillator means;

and in which said control means responds to coincidence between the output signals of said oscillator means and said reference frequency source means to thereafter supply the output of said discriminator means to said variable capacitance means to maintain phase lock between the output signals of said oscillator means and said reference frequency source means.

13. Means for tuning an electronic equipment comprising tunable oscillator means and first tunable circuit means and comprising:

frequency reference signal source means;

frequency-phase discriminator means responsive to the output signal of said oscillator means and the output signal of said reference signal source means to produce a discriminator output signal having characteristics indicative of the relative frequencies of said output signals;

first variable capacitor means permanently connected into said first tunable circuit means for tuning thereof;

a bank of capacitors haivng values which increase in a predetermined ratio;

first switching means having two positions and constructed when in its first position to connect said first variable capacitor means into said oscillator means and to disconnect said bank of capacitors from said oscillator means, and further constructed when in in its second position to disconnect said first vairable capacitor means from said oscilaltor means and to connect said bank of capacitors into said oscillator means;

said variable capacitor means constructed to respond to the output of said discriminator means to change its capacitance in a direction calculated to alter the frequency of said oscillator means towards that of said frequency reference signal source means;

said first switching means responsive to frequency coincidence between the output signals of said oscillator means and said reference signal source means to change to its second state;

clock pulse source means;

counting means responsive to the output of said clock pulse source means and said discriminator means to count up or down in accordance with the characteristic of said discriminator output signal;

second switching means constructed to respond to the count contained in said counting means to selectively connect any one or any combination of the capacitors in said bank of capacitors into said oscillator means; and control means responsive to the condition of frequency coincidence between the output signals of said oscillator means and said reference signal source means to disconnect said clock pulse source from said counting means.

14. Means for tuning an electronic equipment in accordance with claim 13 comprising:

means constructed to reset said counting means to a given value immediately prior to the connecting of said bank of capacitors into said oscillator means;

and in which said second switching means is constructed to respond to said given reset value of said counting means to connect a predetermined proportion of said bank of capacitors into said oscillator means.

15. Means for tuning an electronic equipment in accordance with claim 14 and comprising:

second variable capacitance means connected into said oscillator means;

and in which said control means is responsive to coincidence between the output signals of said oscillator means and said reference signal source means to thereafter supply the output of said discriminator means to said second valiable capacitance means to maintain phase lock between the output signals of said oscillator means and said reference signal source means

16. Means for tuning an electronic equipment in accordance with claim 15 in which:

said bank of capacitors are arranged to increase in value in geometric progression;

and in which said counting means is a binary counting means.

17. Means for tuning an electronic equipment in accordance with claim 13 in which:

said bank of capacitors are arranged to increase in binary order progression;

and in which said counting means is a binary counting means.

18. Means for tuning an electronic equipment in accordance with claim 17 and comprising:

second variable capacitance means connected into said oscillator means;

and in which said control means is responsive to coincidence between the output signals of said oscillator means and said reference signal source means to thereafter supply the output of said discriminator means to said second variable capacitance means to maintain phase lock between the output signals of said oscillator means and said reference signal source means.

19. Means for tuning an electronic equipment comprising tunable oscillator means and first tunable circuit means and comprising:

frequency reference signal source means;

discriminator means responsive to the output signal of said oscillator means and the output signal of said reference signal source means to produce a discriminator output signal having at least first and second states indicative of the relative frequency values of said output signals;

servo-driven variable capacitor means permanently connected into first circuit means for tuning thereof;

a bank of capacitors having values which increase in a predetermined manner;

first switching means having two positions and constructed when in its first position to connect said servo-driven variable capacitor means into said oscillator means and to disconnect said bank of capacitors from said oscillator means, and further constructed when in its second position to disconnect said servo-driven variable capacitor means from said oscillator means and to connect said bank of capacitors into said oscillator means;

said servo-driven variable capacitor means constructed to respond to the output signal of said discriminator means to change the capacitance thereof in a direction calculated to alter the frequency of said oscillator means towards that of said frequency reference signal source means;

said first switching means responsive to frequency coincidence between the output signals of said oscillator means and said frequency reference signal source means to change to its second state;

clock pulse source means;

second switching means constructed when activated to selectively connect any one of any combination of the capacitors in said bank of capacitors into said oscillator means; and counting means responsive to the output of said clock pulse source means and said discriminator means to count up or down in accordance with the state of said discriminator output signal to activate said second switching means in a predetermined manner calculated to connect or disconnect capacitors into or from said oscillator means until frequency coincidence is again obtained between the output signals of said oscillator means and said reference signal source means;

control means responsive to the condition of frequency coincidence between the output signals of said oscillator means and said reference source to disconnect said clock pulse source from said counting means.

20. Means for tuning an electronic equipment in accordance with claim 19 comprising:

means constructed to reset said counting means to a given value immediately prior to the connecting of said bank of capacitors into said oscillator means;

and in which said second switching means is constructed to respond to said given reset value of said counting means to connect a predetermined proportion of said bank of capacitors into said oscillator means;

21. Means for tuning an electronic equipment in accordance with claim 20 and comprising:

second variable capacitance means connected into said oscillator means;

and in which said control means is responsive to coincidence between the output signals of said oscillator means and said frequency reference signal source means to thereafter supply the output of said discriminator means to said second variable capacitance means to maintain phase lock between the output signals of said oscillator means and said frequency reference signal source means.

22. Means for tuning an electronic equipment in accordance with claim 21 in which:

said bank of capacitors are arranged to increase in value in geometric progression;

and in which said counting means is a binary counting means.

23. Means for tuning an electronic equipment in accordance with claim 19 in which:

said bank of capacitors are arranged to increase in value in binary order progression;

and in which said counting means is a binary counting means.

24. Means for tuning an electronic equipment in accordance with claim 19 and comprising:

second variable capacitance means connected into said oscillator means;

and in which said control means is responsive to coincidence between the output signals of said oscillator means and said frequency reference singal source means to thereafter supply the output of said discriminator means to said second variable capacitance means to maintain phase lock between the output signals of said oscillator means and said frequency reference signal source means.

References Cited

UNITED STATES PATENTS

| | | | |
|---|---|---|---|
| 3,139,593 | 6/1964 | Kaminski et al. | 331—179 X |
| 3,155,922 | 11/1964 | Hackett | 331—179 |
| 3,200,347 | 8/1965 | Kaminski et al. | 331—16 |

ROY LAKE, Primary Examiner

S. H. GRIMM, Assistant Examiner

U.S. Cl. X.R.

331— 25, 35, 36, 177, 179